US012550381B2

(12) United States Patent
Sharma et al.

(10) Patent No.: US 12,550,381 B2
(45) Date of Patent: Feb. 10, 2026

(54) DEVICE, METHOD AND SYSTEM TO PROVIDE EPITAXIAL STRUCTURES OPPOSITE SIDES OF A SEPARATION LAYER BETWEEN CHANNEL STACKS

(71) Applicant: Intel Corporation, Santa Clara, CA (US)

(72) Inventors: Abhishek Sharma, Portland, OR (US); Anand Murthy, Portland, OR (US); Tahir Ghani, Portland, OR (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 634 days.

(21) Appl. No.: 17/856,891

(22) Filed: Jul. 1, 2022

(65) Prior Publication Data

US 2024/0006540 A1 Jan. 4, 2024

(51) Int. Cl.
| | |
|---|---|
| *H01L 29/786* | (2006.01) |
| *H01L 27/06* | (2006.01) |
| *H01L 27/088* | (2006.01) |
| *H01L 29/06* | (2006.01) |
| *H01L 29/423* | (2006.01) |
| *H10D 30/67* | (2025.01) |
| *H10D 62/10* | (2025.01) |
| *H10D 84/83* | (2025.01) |
| *H10D 88/00* | (2025.01) |

(52) U.S. Cl.
CPC ..... *H10D 30/6757* (2025.01); *H10D 30/6735* (2025.01); *H10D 62/121* (2025.01); *H10D 84/83* (2025.01); *H10D 88/00* (2025.01)

(58) Field of Classification Search
CPC ........... H10D 30/6757; H10D 30/6735; H10D 62/121; H10D 84/83; H10D 88/00; H10D 30/014; H10D 30/43
USPC ......................................................... 257/401
See application file for complete search history.

(56) References Cited

U.S. PATENT DOCUMENTS

| | | | |
|---|---|---|---|
| 2020/0294998 A1* | 9/2020 | Lilak ..................... | H01L 23/535 |
| 2023/0163185 A1* | 5/2023 | Fulford .................. | H10D 88/01 |
| | | | 257/233 |
| 2023/0343823 A1* | 10/2023 | Baek ....................... | H10D 30/43 |

* cited by examiner

*Primary Examiner* — Tong-Ho Kim
(74) *Attorney, Agent, or Firm* — Essential Patents Group, LLP

(57) ABSTRACT

Techniques and mechanisms for providing epitaxial structures of an integrated circuit (IC). In an embodiment, an IC comprises a separation layer, and first and second channel stack structures at opposite surfaces of the separation layer. A first source or drain (SD) structure extends to the first channel stack structure, and a second SD structure extends to the second channel stack structure. A hole extends through the separation layer, wherein the first and second SD structures are formed concurrently by a deposition of an epitaxial (epi) material from one side of the hole. An insulator material of the separation layer facilitates separation of the first and second SD structures from each other during the epi deposition. In another embodiment, respective crystal orientations in the first and second SD structures each face the same direction along a vertical dimension which is orthogonal to the surfaces of the separation layer.

20 Claims, 10 Drawing Sheets

500

510
Forming, at a first surface of a separation layer, a first channel stack structure comprising a first plurality of channel structures 512
Forming, at a second surface of the separation layer, a second channel stack structure comprising a second plurality of channel structures 514
Forming a first hole structure that extends to each of the first surface and the second surface 516
Depositing a first epitaxial material into the first hole structure to concurrently form a first SD structure at a first side of the first channel stack structure, and a second SD structure at a second side of the second channel stack structure, wherein the first hole structure extends into a first region which is between the first SD structure and the second SD structure

FIG. 5

# DEVICE, METHOD AND SYSTEM TO PROVIDE EPITAXIAL STRUCTURES OPPOSITE SIDES OF A SEPARATION LAYER BETWEEN CHANNEL STACKS

BACKGROUND

1. Technical Field

This disclosure generally relates to active circuit elements and more particularly, but not exclusively, to the fabrication of epitaxial structures of transistor devices.

2. Background Art

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. In particular, there is an ongoing desire to further condense circuit structures which are included in or otherwise support operation of memory arrays—such as dynamic random access memory (DRAM) and static access memory (DRAM)—or other logic. It is with respect to these and other considerations that the present improvements have been needed. Such improvements may become critical as the desire to improve computational efficiency become even more widespread.

BRIEF DESCRIPTION OF THE DRAWINGS

The various embodiments of the present invention are illustrated by way of example, and not by way of limitation, in the figures of the accompanying drawings and in which:

FIG. 5 illustrates various processes or methods for forming epitaxial structures of an integrated circuit according to an embodiment.

DETAILED DESCRIPTION

Figure 1:
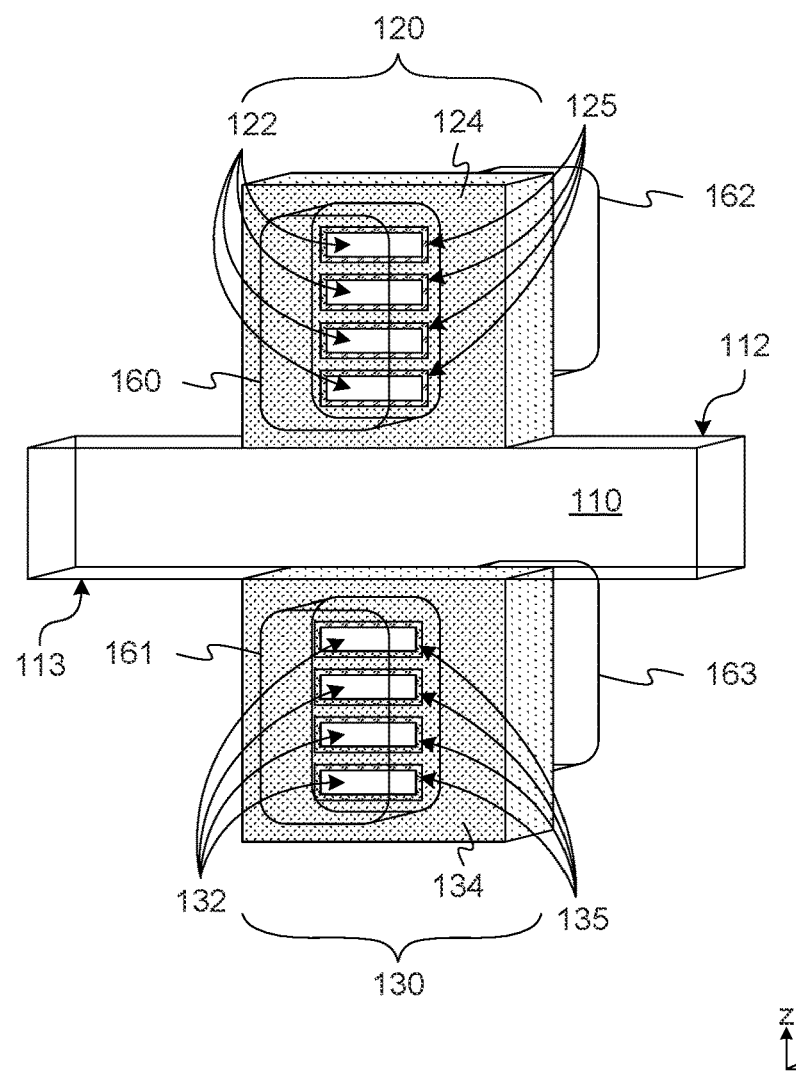
FIG. 1 illustrates features of an integrated circuit comprising epitaxial structures of active circuit elements according to an embodiment.

Embodiments discussed herein variously provide techniques and mechanisms for providing epitaxial structures of an integrated circuit (IC). Certain features of various embodiments are described herein with reference to IC fabrication wherein channel stack structures are variously formed on a separation layer which forms one or more hole structures which are each to accommodate the formation of source or drain (SD) structures. However, it is to be appreciated that such description can be extended to other embodiments wherein a separation layer is to be disposed between any of various additional or alternative types of transistor structures. For example, IC fabrication according to other embodiments comprises forming structures of a first transistor—e.g., the structures including a first one or more channel structures—on a first side of a separation layer. Furthermore, such IC fabrication comprises forming structures of a second transistor—e.g., the structures including a second one or more channel structures—on a second side of the separation layer. In one such embodiment, epitaxial (epi) material is subsequently deposited from one side of the separation layer, and through a hole structure to an opposite side of the separation layer, to concurrently form SD structures which each adjoin a different respective one or more channel structures. Some embodiments provide SD structures for any of various planar transistors, non-planar transistors, or combinations thereof—e.g., including one or more FinFET transistors, one or more gate all around transistors (including nanowires, nanoribbons, etc.) or the like.

In some embodiments, an IC die comprises structures (referred to herein as "channel stack structures") which each include a respective stacked arrangement of channel structures. A given channel stack structure further comprises insulator structures, such as gate dielectics, which each extend between a respective two of the channel structures. A given channel structure (or, for brevity, simply "channel" herein) is operable, as a structure of a respective transistor, to selectively provide a conductive channel, between a source and drain of that transistor, based on a voltage at a gate of the transistor.

In an embodiment, the IC die further comprises a layer (referred to herein as a separation layer) which extends between, and provides at least some electrical insulation between, two channel stack structures. In various embodiments, the two overlapping channel stack structures each adjoin a respective one of two source or drain (SD) structures—e.g., wherein the separation layer forms at least one hole structure which extends in a region between said SD structures. In one such embodiment, the SD structures include a respective artefact of deposition processing wherein an epitaxy material is concurrently directed along respective sides of the channel stack structures to grow the SD structures.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an integrated circuit comprising stacked channel structures and a separation layer therebetween.

FIG. 1 shows a perspective view diagram illustrating features of an integrated circuit (IC) 100 which comprises epitaxial (epi) structures each on a side of a respective channel stack structure according to an embodiment. IC 100 illustrates one example of an embodiment wherein a separation layer extends between two channel stack structures, and wherein source or drain (SD) epi structures, each adjoining a different respective one of the channel structures, are on opposite sides of a hole structure which is formed with the separation layer. In an embodiment, the SD epi structures comprise respective artefacts of a fabrication process which deposits an epi material through the hole formed with the separation layer.

As shown in FIG. 1, IC 100 comprises a separation layer 110, and an upper device which extends to a surface 112 of separation layer 110, and a lower device which extends to another surface 113 of separation layer 110. Surfaces 112, 113 are on opposite respective sides of separation layer 110. A given one of the upper device or the lower device is—or otherwise comprises—a transistor, diode or other suitable active circuit component which includes a stacked arrangement of channel structures. An insulation material of separation layer 110 is, for example, a layer of oxide or nitride or other suitable insulator (e.g., silicon oxide, silicon nitride, or oxynitride, to name a few examples).

For example, the upper device comprises a channel stack structure 120 and—in some embodiments—source or drain (SD) regions 160, 162 which are on opposite respective sides of channel stack structure 120. Channel stack structure 120 includes channels structures 122 (for brevity, also referred to herein as "channels") which are arranged in a stacked configuration with each other. In the example embodiment shown, channels 122 are nanoribbons of semiconductor material, wherein the nanoribbons which are in a vertical (z-axis) stack arrangement, relative to each other, along a direction which is in perpendicular to the surfaces 112, 113 of the separation layer 110. However, channels 122 are nanosheets, nanowires, and/or any of various other suitable channel structures, in other embodiments.

In an embodiment, each one of channels 122 comprises a respective semiconductor material which is configured to selectively conduct current between SC regions 160, 162. For example, the channel stack structure 120 further includes, or is otherwise structurally supported by, a gate electrode structure 124 of the upper device. In one such embodiment, channel stack structure 120 further comprises one or more structures (such as the illustrative insulation structures 125 shown) which variously extend each between a respective two of the channels 122. By way of illustration and not limitation, insulation structures 125 include one or more gate dielectric structures which each surround a respective one or more of channels 122—e.g., wherein said one or more gate dielectric structures are to provide at least partial electrical insulation between a channel and gate electrode structure 124. Conductivity between SC regions 160, 162 is controlled by the application of a voltage to gate electrode structure 124. In one such embodiment, the upper device further comprises gate spacer structures (not shown) which are variously disposed each between gate electrode structure 124 and a respective one of SD epi structures 160, 162.

In various embodiments, the lower device at surface 113 includes one or more features similar to those of the upper device at surface 112. The lower device comprises a channel stack structure 130 and SD epi structures 161, 163 which, for example, provide functionality similar to that of channel stack structure 120 and SD epi structures 160, 162 (respectively). The channel stack structure 130 comprises a gate electrode structure 134, channels 132, and insulation structures 135 which, for example, provide functionality similar to that of gate electrode structure 124, channels 122, and insulation structures 125 (respectively).

In some embodiments, channels 122 and/or channels 132 are instead arranged in a horizontal stack configuration—e.g., wherein the arrangement of channels 122 (for example), as compared to that shown, is instead turned 90 degrees along the y-axis. For example, channels 122 (or channels 132) are alternatively arranged, in a stacked configuration with each other, along a direction which is in parallel with the surfaces 112, 113 of the separation layer 110.

In one such embodiment, various ones of channels 122, 132 each comprise a respective semiconductor material such as one of indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu_2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), lanthanum selenium dioxide ($La_2SeO_2$), or other materials suitable for NMOS devices. Alternatively or in addition, various ones of channels 122, 132 each comprise a respective one of silicon (Si), silicon germanium (SiGe), germanium (Ge), or any of various other materials which are suitable for PMOS devices. In various embodiments, channels 122, 132 comprise the same materials or, in other embodiments, are compositionally different.

Additionally or alternatively, various ones of insulation structures 125, 135 each comprise any of various suitable gate dielectric material(s) such as, e.g., silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In some embodiments, some or all of SD epi structures 160-163 each comprise a respective epitaxially deposited crystalline materials, including, for example, any of various suitable semiconductor materials such as: silicon, SiGe, germanium, silicon carbide, silicon germanium carbide, germanium tin, silicon germanium tin, or other group IV materials; or gallium arsenide (GaAs), aluminum gallium arsenide (AlGaAs), indium gallium arsenide (InGaAs), or other group III-V based ternary and quaternary alloys. In some specific embodiments, SD epi structures 160-163 are formed of an epitaxial deposition such as, e.g., boron doped SiGe or germanium for PMOS, or phosphorus or arsenic-doped silicon for NMOS.

In various embodiments, some or all of SD epi structures 160-163 further comprise (or alternatively, are coupled to) contact structures including any of various suitable low resistivity metals such as, copper, ruthenium, tin, tungsten, aluminum, gold, silver, and platinum.

In some embodiments, gate spacers (not shown)—e.g., each variously between gate electrode structure 124 and a respective one of SD epi structures 160, 162, or between gate electrode structure 134 and a respective one of SD epi structures 161, 163—include, for example, an oxide material, a porous oxide material (which may have a lower k value), a silicon nitride, silicon dioxide, an oxynitride, a carbon-doped oxide, a carbon-doped oxynitride, or any of various other suitable insulator materials (or combinations thereof). Additionally or alternatively, gate electrode structures 124, 134 are coupled to—or alternatively, include—respective gate electrodes (not shown) which, for example, comprise any of a wide range of suitable metals or metal alloys, such as, e.g., aluminum, tungsten, titanium, tantalum, copper, titanium nitride, or tantalum nitride.

In some embodiments, IC 100 comprises one or more artefacts of a fabrication process by which a given two SD structures are concurrently formed, each at a side of a different channel stack structure, on opposite sides of a separation layer 110. By way of illustration and not limitation, separation layer 110 forms at least in part a first hole structure that extends through separation layer 110—i.e., to each of surface 112 and surface 113. The first hole structure extends into a first region which is between SD regions 160, 161. For example, an insulator material forms a first sidewall structure of separation layer 110, wherein the first sidewall structure is aligned with (or otherwise proximate to) respective first sides of channel stack structure 120 and channel stack structure 130. In an embodiment, SD regions 160, 161 variously extend horizontally past the first sidewall structure—e.g., wherein SD region 160 is over the first hole structure, and the first hole structure is over SD region 161.

In one such embodiment, separation layer 110 further forms at least in part a second hole structure that similarly extends through separation layer 110. The second hole structure extends into a second region which is between SD regions 162, 163. For example, the insulator material of separation layer 110 further forms a second sidewall structure which is aligned with (or otherwise proximate to) respective second sides of channel stack structure 120 and channel stack structure 130. In an embodiment, SD regions 162, 163 variously extend horizontally past the second sidewall structure—e.g., wherein SD region 162 is over the second hole structure, and the second hole structure is over SD region 162.

In some embodiments, an additional or alternative artefact of fabrication processing includes a relationship between a vertical extent of an SD region above an adjoining channel stack structure, and a vertical extent of that SD region below the same adjoining channel stack structure. Such a relationship is based on a tendency for epi materials to grow relatively more quickly toward a direction from which an epi material is being deposited. In one example embodiments, some or all of SD epi structures 160-163 each has a respective vertical span which is skewed in the same direction (e.g., relative to the vertical span of the channel structures which adjoin the SD epi structure in question).

In some embodiments, an additional or alternative artefact of fabrication processing includes the crystal orientation of the respective epi materials in two or more of SD epi structures 160-163. By way of illustration and not limitation, in one such embodiment, a first crystal orientation of a first epitaxial material in SD region 160, and a second crystal orientation of that same first epitaxial material in SD region 161, each face a first direction along the z-dimension shown.

In some embodiments, IC 100 further includes—or alternatively, accommodates coupling to—any of various suitable circuits (not shown) which facilitate, and/or otherwise operate based on, a signal or voltage being provided to one or each of the upper device and the lower device. For example, additional circuitry of IC 100 is to provide a voltage to one or each of gate electrode structure 124 or gate electrode structure 134, and/or is to conduct a current with one of SD epi structures 160-164. However, some embodiments are not limited to a particular type of signal or voltage which is provided to, or received from, a given one of the upper device or the lower device. Furthermore, some embodiments are not limited to a particular functionality that is provided by a source circuit (or sink circuit) which is coupled to operate with the upper device or lower device.

FIGS. 2A through 2H show various cross-sectional side views of structures each during a respective one of multiple stages 200-207 of processing to fabricate an integrated circuit according to an embodiment. Stages 200-207 illustrates one example of an embodiment which forms SD epi structures each on a respective side of a corresponding one of two channel stack structures which are on opposite respective sides of a separation layer. In various embodiments, processing such as that illustrated by stages 200-207 provides circuit structures such as those of IC die 100.

Figure 2A:
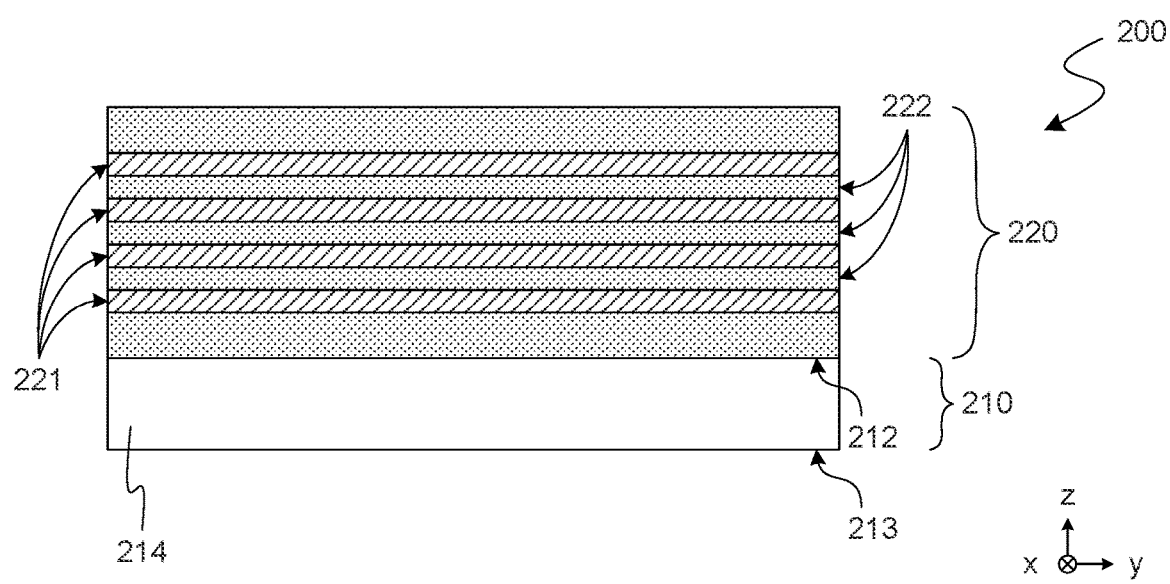
FIGS. 2A through 2H illustrate example structures as selected fabrication operations are performed according to an embodiment.

As shown in FIG. 2A, stage 200 comprises fabricating, receiving or otherwise providing a separation layer 210 which comprises an insulation material 214 (such as insulation material 111) the facilitates at least some electrical insulation between a first active circuit element and a second active circuit element. In various embodiments, insulation material 214 comprises hafnium oxide ($HfO_2$), silicon oxide ($SiO_2$), silicon carbide (SiC), silicon nitride (SiN), or any of various other suitable insulator materials.

In an embodiment, stage 200 further comprises growing, attaching or otherwise forming a superlattice 220 on surface 212 of separation layer 210. Superlattice 220 comprises an arrangement of alternating first layers (referred to herein as "active" layers) and second layers (referred to herein as "buffer" layers) which are to subsequently by processed to form various portions of a channel stack structure. By way of illustration and not limitation, superlattice 220 comprises active layers 221, some or all of which each comprise a respective semiconductor material which is to be further processed to provide a respective channel structure. In one such embodiment, superlattice 220 further comprises buffer layers 222, some or all of which are to provide a respective insulator structure, or (alternatively) are to be replaced—e.g., with gate dielectric structures, gate electrode structures, spacer structures and/or the like.

In one such embodiment, the active layers 221 are layers of silicon (Si), wherein the buffer layers 222 are layers of silicon germanium (SiGe) or, for example, of pure germanium (Ge). In an embodiment, the active layers 221 are layers of germanium (Ge), wherein the buffer layers 222 are layers of silicon germanium (SiGe). In still another embodiment, the active layers 221 are layers of indium gallium arsenide (InGaAs), wherein the buffer layers 222 are layers of indium arsenide (InAs). However, other suitable combinations of active layer materials and buffer layer materials are provided in different embodiments.

Figure 2B:
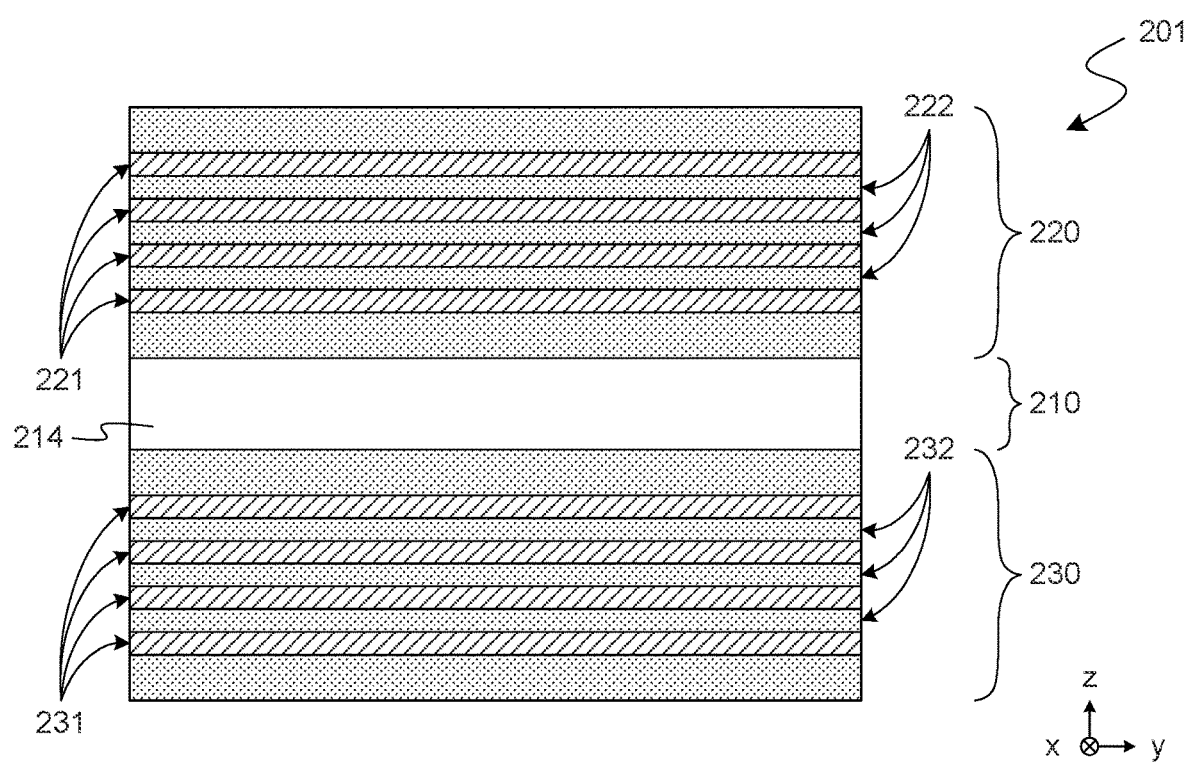

At the stage 201 shown in FIG. 2B, another superlattice 230 is attached to, or otherwise provided at, the opposite surface 213 of separation layer 210. In one such embodiment, the providing of superlattice 230 at surface 213 includes performing a wafer level transfer wherein (for example) the structures formed at stage 200 are attached to a carrier wafer, and inverted or otherwise repositioned to facilitate attachment of the superlattice 230 to surface 213. Coupling of superlattice 230 to surface 213 comprises operations which, for example, are adapted from various conventional wafer adhesion techniques, which are not detailed herein to avoid obscuring certain features of various embodiments.

Similar to superlattice 220, superlattice 230 comprises an interleaving arrangement of active layers 231 and buffer layers 232—e.g., wherein a first semiconductor material of active layers 221 is the same as (or alternatively, is different from) a second semiconductor material of active layers 231).

Superlattices 220, 230 are to be subsequently processed each to variously form features of a different respective channel stack structure.

In some embodiments, formation of such channel stack structures comprises performing various additive operations and subtractive operations—e.g., comprising patterning, etching, and deposition processes—on one side of the assembly shown in stage 201, to form a first channel stack structure. After such formation, the partially processed assembly is inverted, and additional processing is performed on the opposite side to similarly form a second channel stack structure. In alternative embodiments, formation of the channel stack structures comprises alternately processing the opposite sides of the assembly, multiple times, in succession, to form the first and second channel structures concurrently.

Figure 2C:
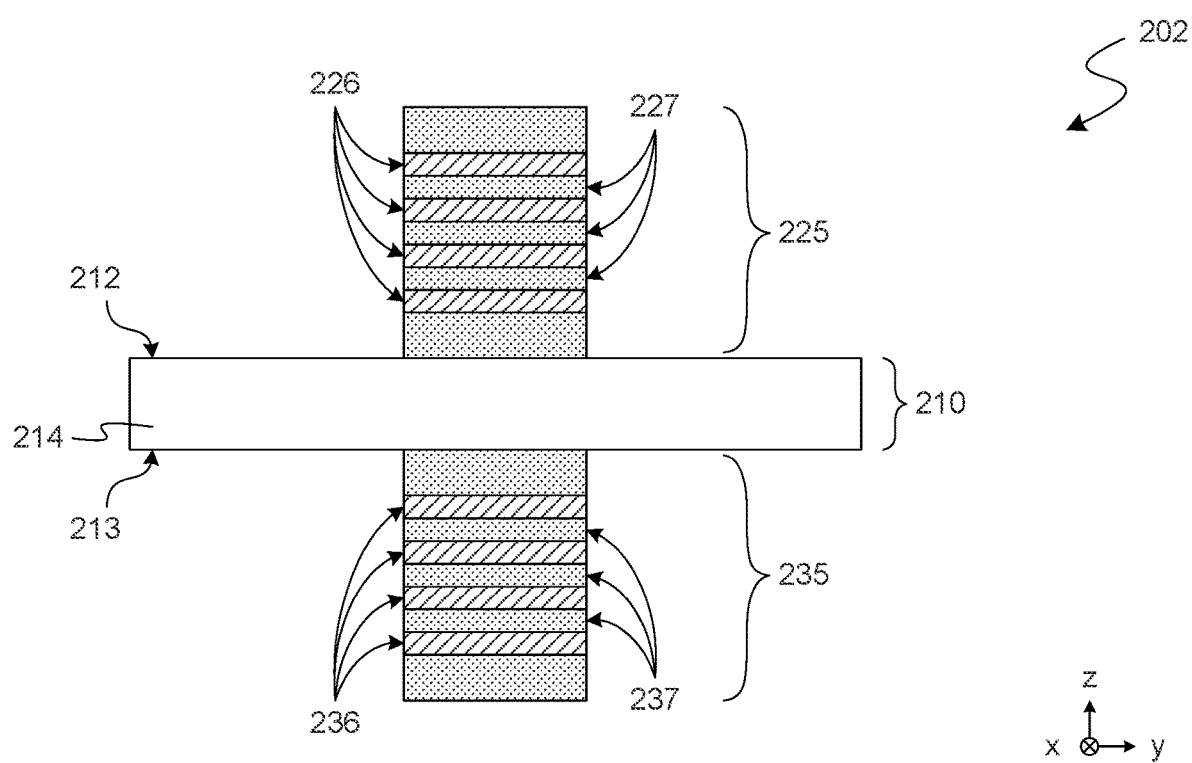

In the example embodiment illustrated by the stage 202 shown in FIG. 2C, superlattices 220, 230 are variously subjected to pattern, etch and/or other suitable processing to form, for example, a patterned superlattice structure 225 at surface 212, and another patterned superlattice structure 235 at surface 213 (respectively). As a result of such processing, superlattice structure 225 comprises remaining portions 226 of active layers 221, and remaining portions 227 of buffer layers 222—e.g., wherein superlattice structure 235 similarly comprises remaining portions 236 of active layers 231, and remaining portions 237 of buffer layers 232. In an embodiment, additional processing is to form, from portions 226 and 236, respective channels of a pair of channel stack structures (such as channel stack structure 120 and channel stack structure 130).

Figure 2D:
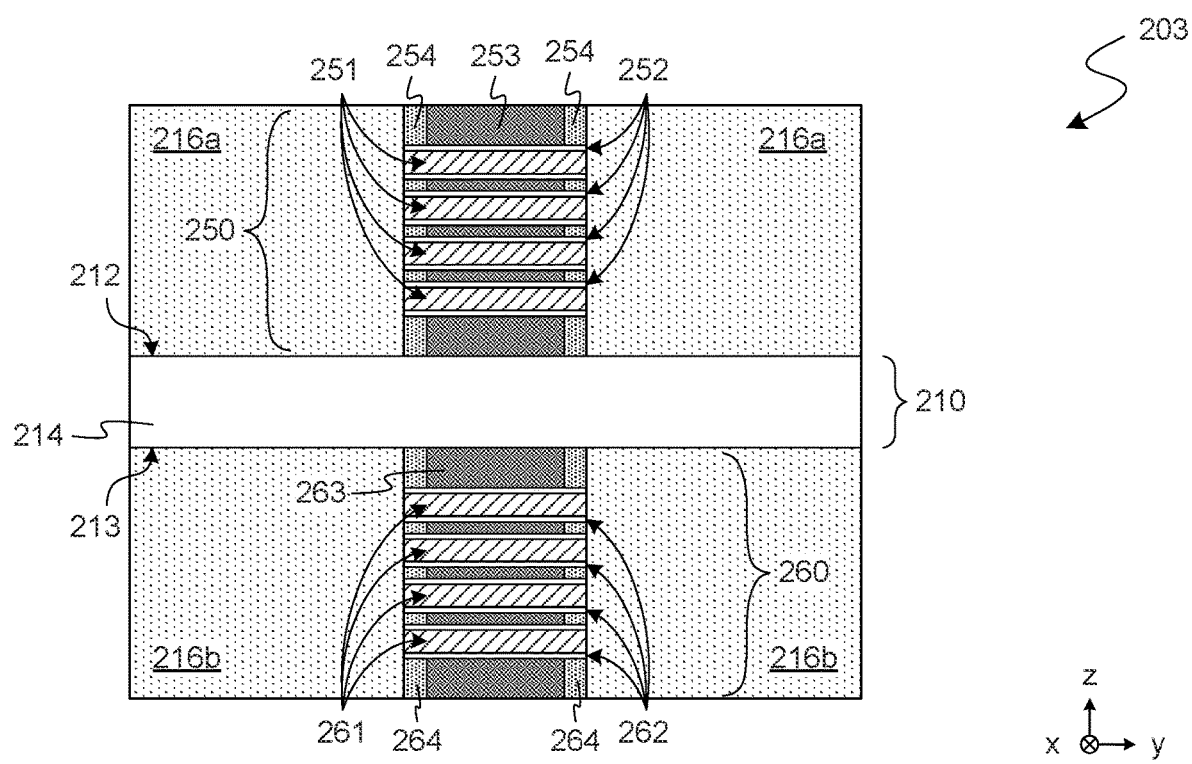

By way of illustration and not limitation, as illustrated by the stage 203 shown in FIG. 2D, additional pattern, etch and deposition processes are performed to provide on surface 212 a channel stack structure 250 which comprises channels 251, and insulation structures 252 which variously extend each between a respective two of the channels 251. In the example embodiment shown, insulation structures 252 are gate dielectrics which each extend around a corresponding one of the channels 251—e.g., wherein channels 251 each comprise some or all of a corresponding one of portions 226. In one such embodiment, channel stack structure 250 further includes, or is otherwise structurally supported by, a gate electrode structure 253 which (for example) extends around and between insulation structures 252. Additionally or alternatively, channel stack structure 250 comprises (or adjoins) spacer structures 254 which are each at a respective side of gate electrode structure 253.

In one such embodiment, the additional processes further provide on surface 213 another channel stack structure 260 which comprises channels 261, and insulation structures 262 which variously extend each between a respective two of the channels 261. In the example embodiment shown, insulation structures 262 are gate dielectrics which each extend around a corresponding one of the channels 261—e.g., wherein channels 261 each comprise some or all of a corresponding one of portions 226. In one such embodiment, channel stack structure 260 further includes, or is otherwise structurally supported by, a gate electrode structure 263 which (for example) extends around and between insulation structures 262—e.g., wherein spacer structures 264 are each at a respective side of gate electrode structure 263. In various embodiments, formation of channel stack structures 250, 260 include operations which (for example) are adapted from conventional techniques for fabricating multi-channel transistor structures. Certain features of such conventional techniques are not detailed herein to avoid obscuring aspects of such embodiments.

At some point during or after fabrication of channel stack structures 250, 260, one or more insulator layers (illustrated as the example insulation structure 216a shown) are deposited on or otherwise formed at surface 212—e.g., in regions which adjoin channel stack structure 250. Alternatively or in addition, one or more insulator layers (illustrated as the example insulation structure 216b shown) are deposited on or otherwise formed at surface 213—e.g., in regions which adjoin channel stack structure 260.

In various embodiments, one or each of insulation structures 216a, 216b is formed from: (1) an oxide, such as silicon dioxide ($SiO_2$), aluminum oxide ($Al_2O_3$), or a carbon (C)-doped oxide; (2) a nitride, such as silicon nitride ($Si_3N_4$); (3) a polymer, such as perfluorocyclobutane or polytetrafluoroethylene; (4) a phosphosilicate glass (PSG); (5) a fluorosilicate glass (FSG); (6) an organosilicate glass (OSG), such as silsesquioxane or siloxane, carbosilane material (e.g., methyl- or ethyl-bridged silicates or carbosilane-ringed structures, such as 1,3,5-trisilacyclohexane derivatives); and/or (7) a combination of any one or more thereof. It should be noted, however, that the present disclosure is not so limited, as in a more general sense, and in accordance with some embodiments, insulation structures 216a, 216b are formed, in part or in whole, from any dielectric material (e.g., low-K dielectric, high-K dielectric, or otherwise), as desired for a given target application or end-use. In accordance with some embodiments, insulation structures 216a, 216b are formed, for example, using: (1) a physical vapor deposition (PROVIDE) process; (2) a chemical vapor deposition (CVD) process, such as plasma-enhanced CVD (PECVD); (3) a spin-on deposition (SOD) process; and/or (4) a combination of any one or more thereof. Other suitable materials and techniques for forming insulation structures 216a, 216b will depend on a given application and will be apparent in light of this disclosure.

Figure 2E:
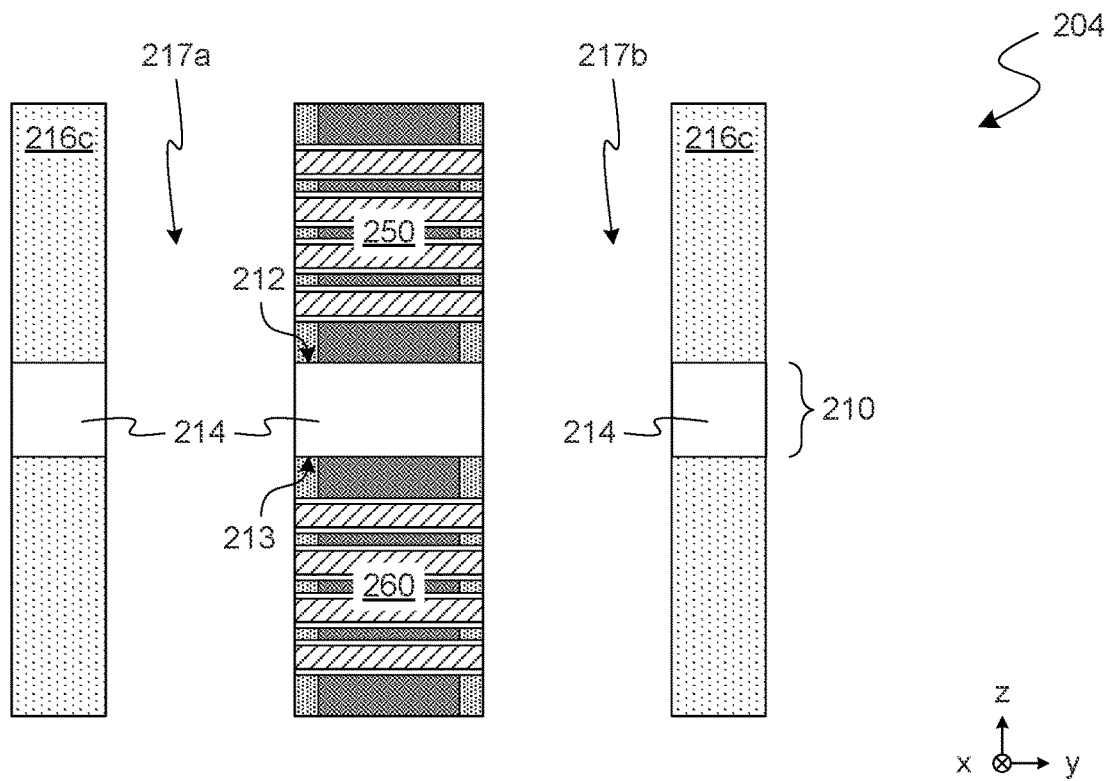

As illustrated by the stage 204 shown in FIG. 2E, additional processing—e.g., including any of various suitable pattern and etch operations—is performed to form one or more holes which each extend through separation layer 210, wherein respective sides of channel stack structures 250, 260 are variously exposed on opposite respective sides of the one or more holes. By way of illustration and not limitation, such additional fabrication results in holes 217a, 217b which are formed at least in part with respective sides of channel stack structures 250, 260, with sidewall structures in the insulation material 214 of separation layer 210, and (in some embodiments) with sidewall structures of an insulation structure 216c that, for example, is formed from insulation structures 216a, 216b.

Figure 2F:
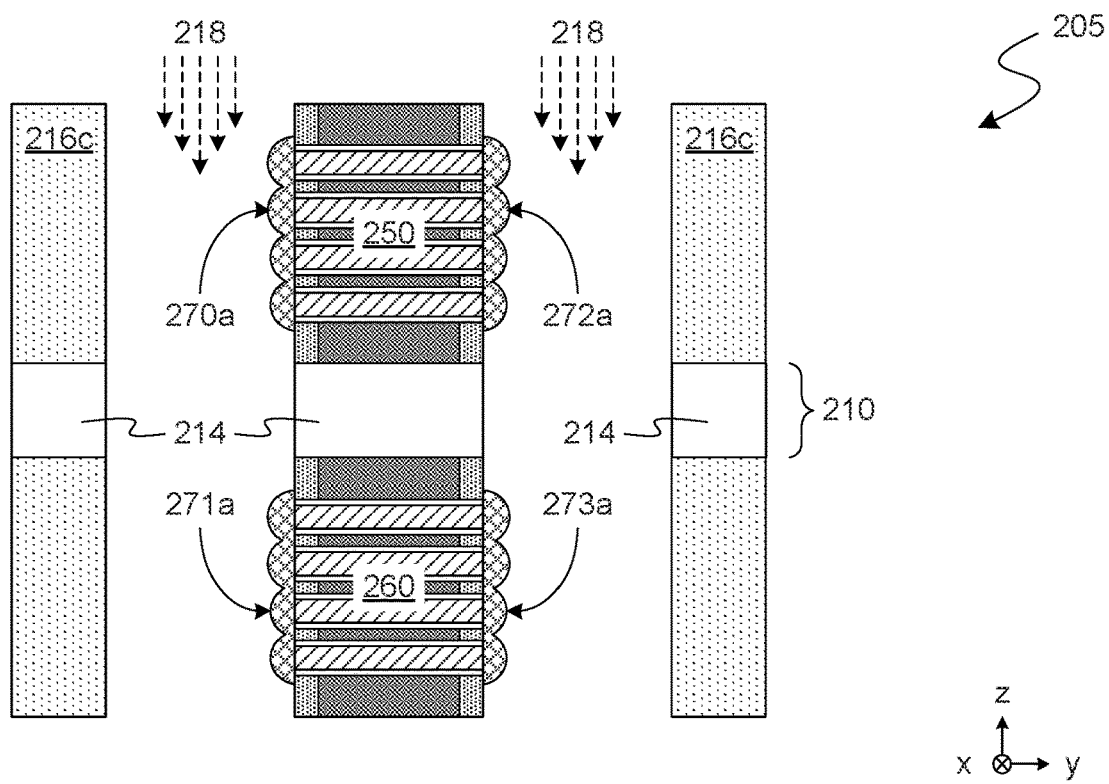

As illustrated by the stage 205 shown in FIG. 2F, a deposition of an epitaxy material 218 is performed through holes 217a, 217b—and through a patterned mask (not shown) on insulation structure 216c—to begin a growth of epitaxial bodies which are to variously function each as source or drain (SD) structure of a respective active circuit element. In an illustrative scenario according to one embodiment, epitaxial structures 270a, 272a begin to grow, during the deposition of epitaxy material 218, at a first side and a second side (respectively) of channel stack structure 250. Epitaxial structures 270a, 272a are variously coupled to each other via the channels 251 of channel stack structure 250. In one such embodiment, epitaxial structures 271a, 273a similarly begin to grow, during the deposition of epitaxy material 218, at a first side and a second side (respectively) of channel stack structure 260. Epitaxial structures 271a, 273a are variously coupled to each other via the channels 261 of channel stack structure 260.

In various embodiments, deposition of epitaxy material 218—into the top sides of holes 217a, 217b to form epitaxial structures 270a-273a—comprises operations which, for example, are adapted from any of various conventional epitaxial deposition methods such as low pressure chemical vapor deposition (CVD), vapor phase epitaxy, molecular beam epitaxy, or the like. By way of illustration and not limitation, epitaxial structures 270a-273a may be formed from any of a variety of well-known epitaxy materials having a lattice constant. In one such embodiment, epitaxial structures 270a-273a are formed from a single crystalline semiconductor material such as, but not limited to Si, Ge, SiGe, GeSn, GaAs, InSb, GaP, GaSb, InAlAs, InGaAs, GaSbP, GaAsSb, GaN, GaP, and InP.

In one such embodiment, epitaxial structures 270a-273a are formed from the same semiconductor material (e.g., Ge) used to form the channels 251 of channel stack structure 250 and/or the channels 261 of channel stack structure 260. In another embodiment, epitaxial structures 270a-273a are formed from a material (e.g., GaAs) having a lattice constant greater than the lattice constant of a semiconductor material (e.g., Ge) used to form channels 251 and/or channels 261—e.g., in order to enhance a uniaxial compressive lattice stress in the channels.

In another specific embodiment, epitaxial structures 270a-273a are formed from silicon. In one such embodiment, epitaxial structures 270a-273a are formed from the same semiconductor material (e.g., Si) used to form channels 251 and/or channels 261. In other embodiments, epitaxial structures 270a-273a are formed from a material (e.g., silicon carbide or carbon-doped silicon) having a lattice constant less than the lattice constant of the semiconductor material (e.g., Si) used to form channels 251 and/or channels 261—e.g., in order to enhance the uniaxial tensile lattice stress in the channels. However, other embodiments are not limited to a particular lattice constant of epitaxial structures 270a-273a, and/or are not limited to a particular type of stress (if any) which is to be provided with epitaxial structures 270a-273a.

Figure 2G:
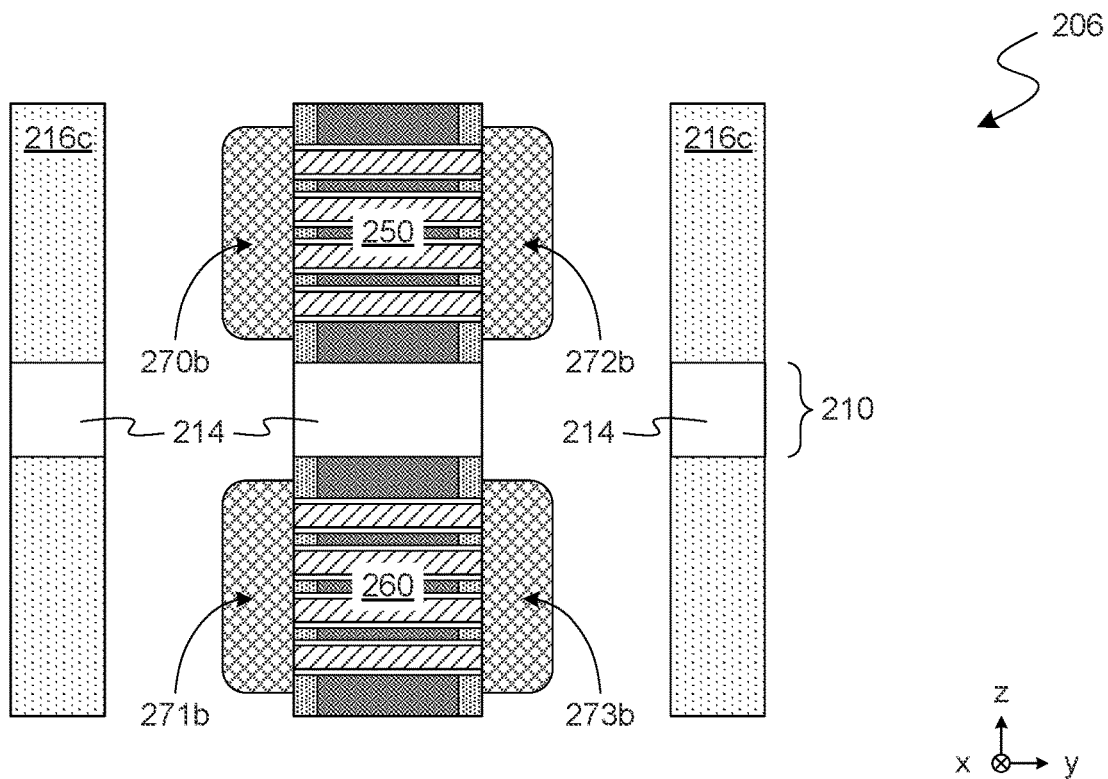

Deposition of epitaxy material 218 continues until epitaxial structures 270a-273a have grown to form the SD structures 270b-273b (respectively) which are illustrated by the stage 206 shown in FIG. 2G. In various embodiments, growth of epitaxial structures 270a-273a is "self-arrested" due at least in part to the various arrangements of conductive surface portions and insulator surface portions which make up the respective sides of channel stack structures 250, 260. For example, the various ends of channel structures 251, and channel structures 261 each provide a respective conductive surface portion on which epitaxy material 218 can begin to crystalize. By contrast, insulation structures 252, 262 and spacer structures 254, 264 variously provide insulator surface portions which—relative to channel structures 251, 261—are less amenable to crystallization of epitaxy material 218. Furthermore, epitaxial structures will not crystallize on the sidewall structures of separation layer 210 which variously form part of holes 217a, 217b.

Therefore, in providing one or more holes which extend through separation layer 210, some embodiments variously enable the concurrent and selective growth of two or more epitaxial structures (e.g., including epitaxial structures 270a, 271a and/or including epitaxial structures 272a, 273a) each on a side of a different respective one of channel stack structures 250, 260. By way of illustration and not limitation, some embodiments enable a concurrent growth of epitaxial structures on different respective sides of separation layer 210—e.g., using an epi deposition into the top sides (but not the bottom sides) of holes 217a, 217b. As a result, some embodiments avoid a need for the structures shown at stage 205 to be inverted for additional deposition of epitaxy material 218 into the opposite sides of holes 217a, 217b. In some embodiments, this further avoids a need to form additional patterned mask structures on the opposite side of the structures shown at stage 205.

Figure 2H:
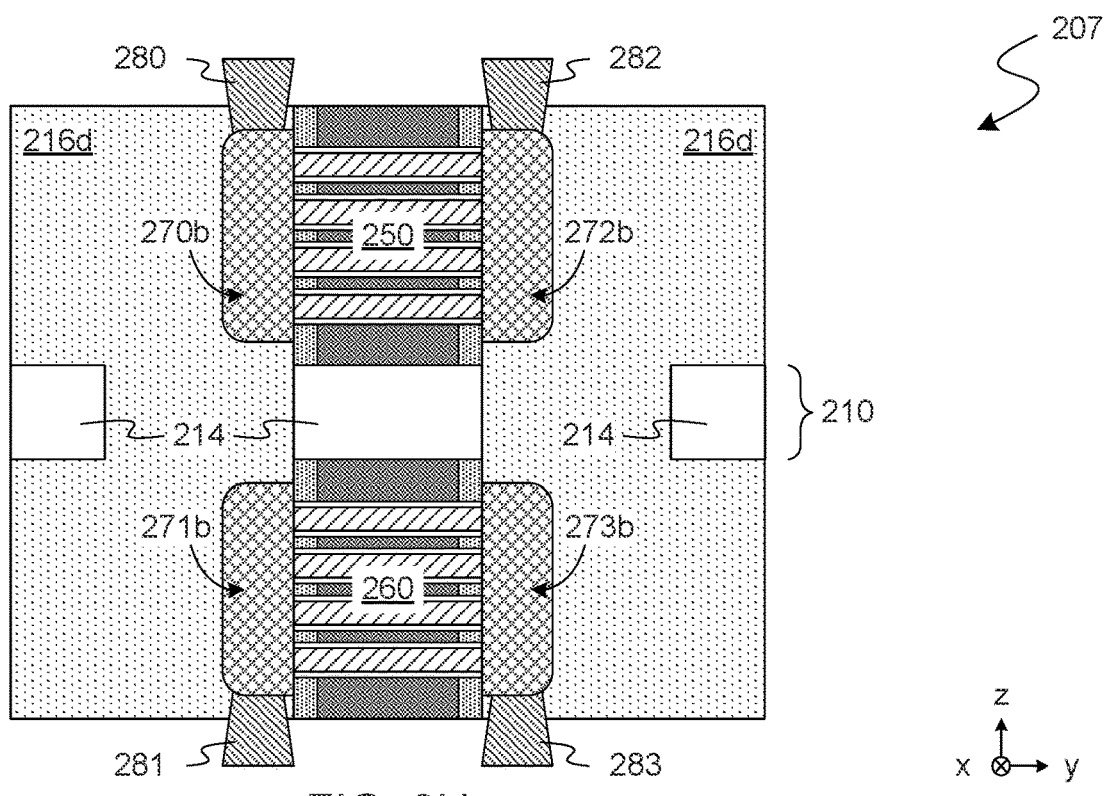

As illustrated by the stage 207 shown in FIG. 2H, further patterning, etching, metallization and/or other processing is performed to provide additional structures of the active circuit elements, and (in some embodiments) to provide structures which couple the active circuit elements to other circuitry. By way of illustration and not limitation, such additional processing is to form various contacts 280-283 on SD structures 270b-273b (respectively). Alternatively or in addition, the additional processing is to fill holes 217a, 217b—e.g., by supplementing (or replacing) insulation structure 216c to insulation structure 216d.

In some embodiments, channel stack structures 250, 260 provide functionality such as that of channel stack structures 120, 130 (respectively). In one such embodiment, channels 251, insulation structures 252, and gate electrode structure 253 correspond functionally to channels 122, insulation structures 125, and gate electrode structure 124 (respectively)—e.g., wherein channels 261, insulation structures 262, and gate electrode structure 263 correspond functionally to channels 132, insulation structures 135, and gate electrode structure 134 (respectively). Furthermore, separation layer 210 provides functionality of separation layer 110—e.g., wherein surface 212, surface 213, and insulation material 214 correspond functionally to surface 112, surface 113, and insulation material 111 (respectively). Further still, SD structures 270b-273b correspond functionally to SD structures 160-163 (respectively), in some embodiments.

Figure 3:
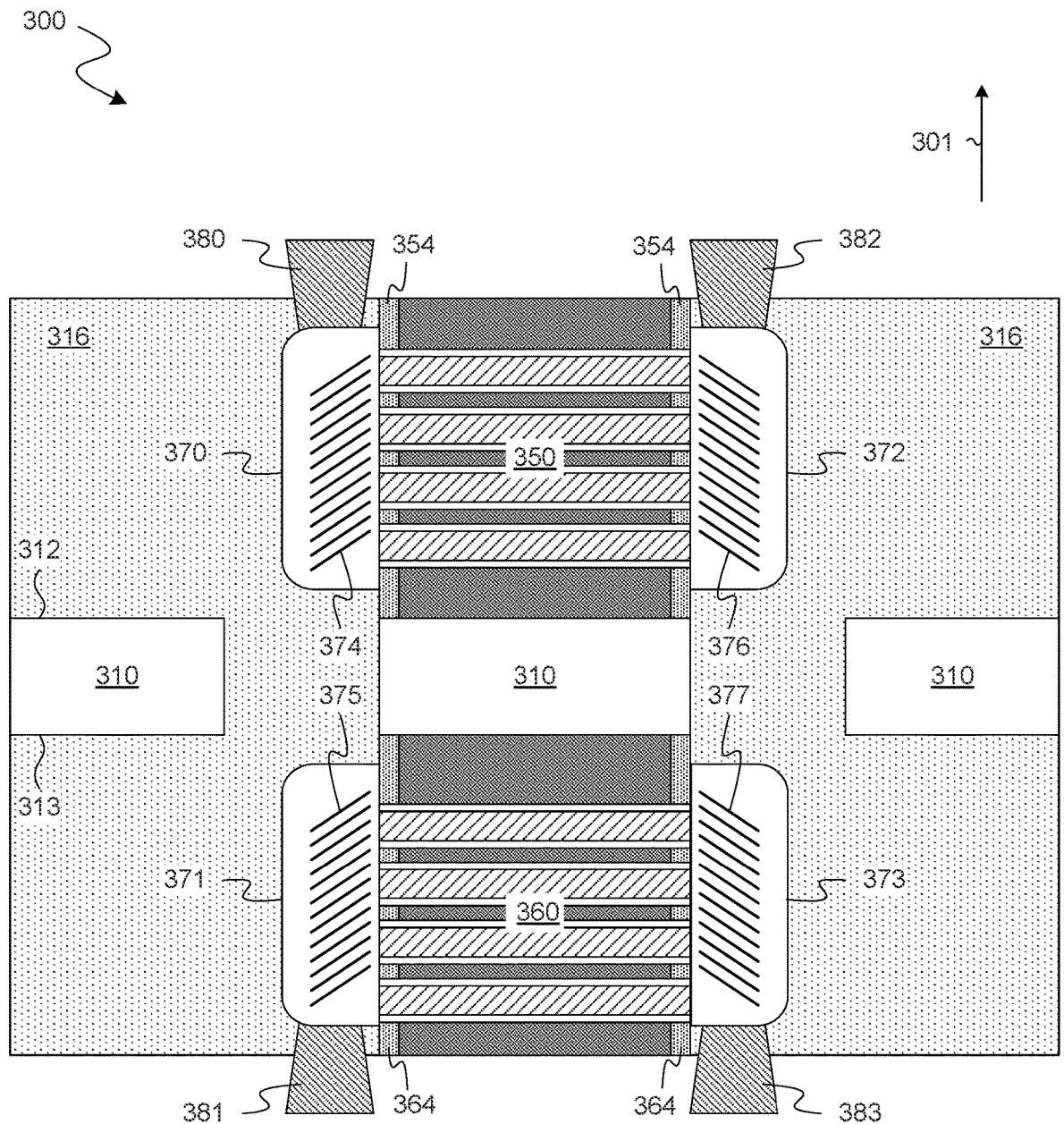
FIGS. 3 and 4 illustrate features of respective integrated circuits each comprising epitaxial structures of active circuit elements according to a corresponding embodiment.

FIG. 3 shows features of an integrated circuit (IC) 300 which includes source or drain (SD) structures on different respective sides of a separation layer according to an embodiment. IC 300 is an example of an embodiment which has one or more artefacts of a fabrication process—such as that illustrated by stages 200-207—to concurrently form SD structures each on a respective side of a corresponding channel stack structure. In an embodiment, IC 300 includes features of IC 100, for example.

As shown in FIG. 3, IC 300 comprises a separation layer 310, a first active circuit element on one surface 312 of separation layer 310, and a second active circuit element on another surface 313 of separation layer 310 (wherein surface 312 is opposite surface 313). The first active circuit element (e.g., a first transistor) comprises a channel stack structure 350 at surface 312, and SD structures 370, 372 which are each at a different respective side of channel stack structure 350. In one such embodiment, channel stack structure 350 comprises first channels, first gate dielectric structures, and a first gate electrode structure—e.g., such as channels 122, insulation structures 125, and gate electrode structure 124 (respectively). Responsive to a given voltage at the first gate electrode structure, the first channels of channel stack structure 350 are to conduct one or more currents between SD structures 370, 372. In the example embodiment shown, spacer structures 354 provide electrical insulation between the first gate electrode structure and SD structures 370, 372.

Similarly, the second active circuit element (e.g., a second transistor) comprises a channel stack structure 360 at surface 313, and SD structures 371, 373 which are each at a different respective side of channel stack structure 360. In one such embodiment, channel stack structure 360 comprises second channels, second gate dielectric structures, and a second gate electrode structure—e.g., such as channels 122, insulation structures 125, and gate electrode structure 124 (respectively). Responsive to a given voltage at the second gate electrode structure, the second channels of channel stack structure 360 are to conduct one or more currents between SD structures 371, 373. In the example embodiment shown, spacer structures 364 provide electrical insulation between the second gate electrode structure and SD structures 371, 373.

Two hole structures are formed by separation layer 310—e.g., wherein one such hole structure extends between SD structures 370, 372, and wherein another such hole structure extends between SD structures 371, 373. In an embodiment, the hole structures are an artefact of fabrication processing to concurrently deposit epi material of SD structures 370, 372 (and/or to concurrently deposit epi material of SD structures 371, 373). In one such embodiment, the hole structures have been filled by one or more insulator layers (represented as the illustrative insulation structure 316 shown).

Due to fabrication processing—such as that illustrated by stages 200-207— the epitaxial materials of SD structures 370-373 have respective crystal orientations 374-377, each of which has a vertical component in the same direction (such as the illustrative direction 301 shown). For example, the vertical component of a crystallographic orientation in one of the upper SD structures 370, 372 will have the same direction as that for the corresponding one of the lower SD structures 371, 373 (which is overlapped by that upper SD structure). By way of illustration and not limitation, in one such embodiment, each of SD structures 370-373 comprises SiGe having a <1, 1, 1> crystal direction. Because epi deposition—e.g., from only one direction, and through the hole structures which each extended through separation layer 310—formed both of SD structures 370, 372 (and/or formed both of SD structures 371, 373), the crystal orientations 374, 376 (and/or crystal orientations 375, 377) each face the same direction along the vertical (z-axis) dimension.

In various embodiments, IC 300 includes some or all of the features of the structures formed at stage 207. For example, separation layer 310 provides functionality of separation layer 210—e.g., wherein surfaces 312, 313 correspond to surfaces 212, 213 (respectively). In one such embodiment, insulation structure 316 provides functionality such as that of insulation structure 216. Additionally or alternatively, channel stack structures 350, 360 provide functionality such as that of channel stack structures 250, 260 (respectively)—e.g., wherein spacer structures 354 of channel stack structure 350, and spacer structures 364 of channel stack structure 360 correspond functionally to spacer structures 254, and spacer structures 264 (respectively). In some embodiments, epitaxial structures 370-373 provide functionality such as that of epitaxial structures 270-273 (respectively). Alternatively or in addition, contacts 380-383 correspond functionally to contacts 280-283 (respectively).

Figure 4:
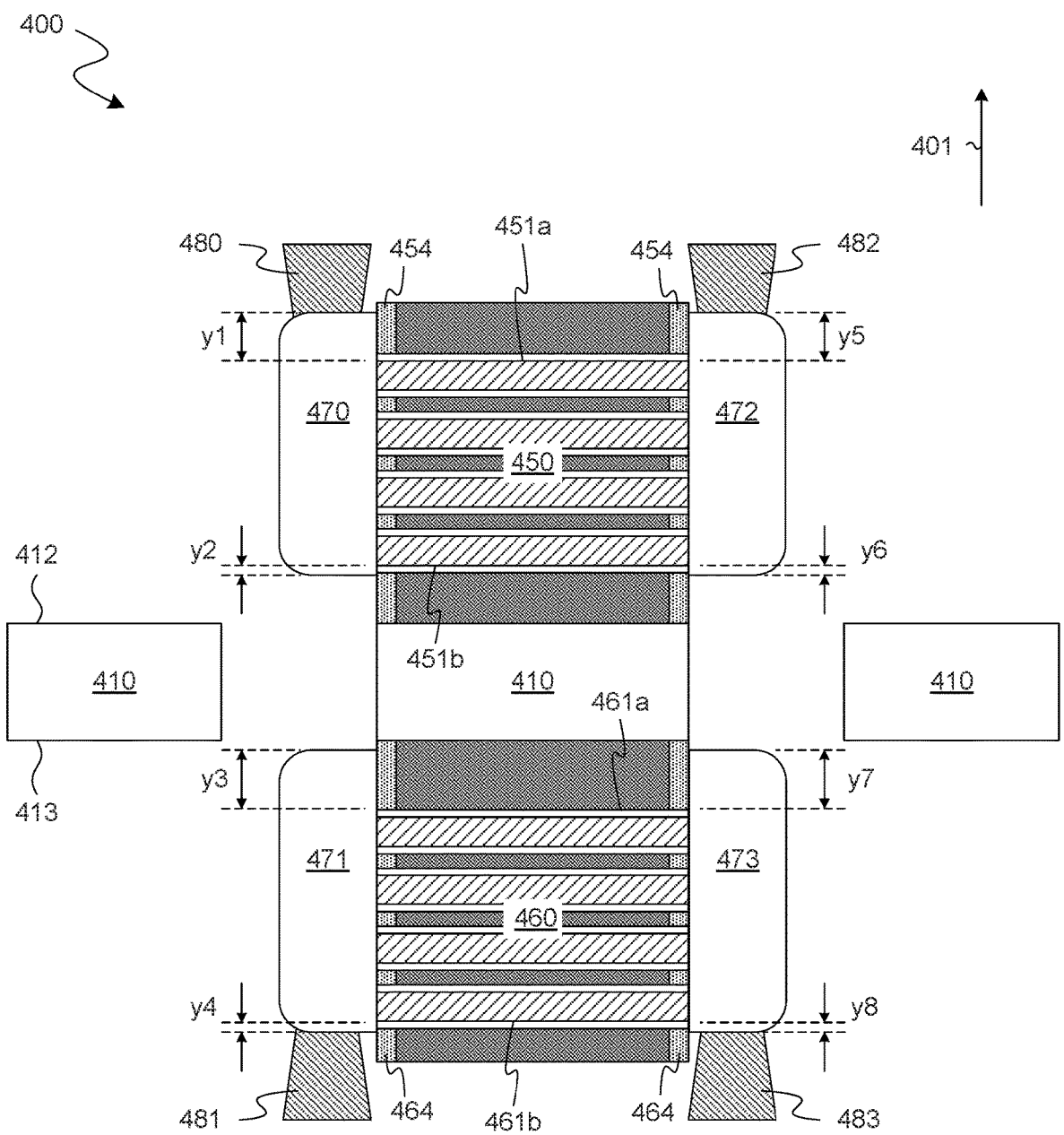

FIG. 4 shows features of an integrated circuit (IC) 400 which includes source or drain (SD) structures on different respective sides of a separation layer according to another embodiment. IC 400 has one or more artefacts of a fabrication process to concurrently form SD structures each on a respective side of a corresponding channel stack structure. In an embodiment, IC 400 includes features of IC 100, for example.

As shown in FIG. 4, IC 400 comprises a separation layer 410, a first active circuit element (e.g., a first transistor) on one surface 412 of separation layer 410, and a second active circuit element (e.g., a second transistor) on another surface 413 of separation layer 410. The first active circuit element comprises a channel stack structure 450 at surface 412, and SD structures 470, 472 which are each at a different respective side of channel stack structure 450. In one such embodiment, channel stack structure 450 comprises first channels, first gate dielectric structures, and a first gate electrode structure. Responsive to a voltage at the first gate electrode structure, the first channels of channel stack structure 450 conduct one or more currents between SD structures 470, 472. In the example embodiment shown, spacer structures 454 provide electrical insulation between the first gate electrode structure and SD structures 470, 472.

Similarly, the second active circuit element comprises a channel stack structure 460 at surface 413, and SD structures 471, 473 which are each at a different respective side of channel stack structure 460. In one such embodiment, channel stack structure 460 comprises second channels, second gate dielectric structures, and a second gate electrode structure. Responsive to a voltage at the second gate electrode structure, the second channels of channel stack structure 460 conduct one or more currents between SD structures 471, 473. In the example embodiment shown, spacer structures 464 provide electrical insulation between the second gate electrode structure and SD structures 471, 473.

Two hole structures are formed by separation layer 410—e.g., wherein one such hole structure extends between SD structures 470, 472, and wherein another such hole structure extends between SD structures 471, 473. In an embodiment, the hole structures are an artefact of fabrication processing to concurrently deposit epi material of SD structures 470, 472 (and/or to concurrently deposit epi material of SD structures 471, 473). In one such embodiment, the hole structures have been filled by one or more insulator structures (not shown).

Furthermore, there is a general tendency for a given epi structure to grow more quickly toward a side from which an epi material (such as epitaxy material 218) is incident upon said epi structure—e.g., as compared to the rate of growth on an opposite ("shadow") side of the epi structure. Accordingly, in various embodiments, some or all of SD structures 470-473 additionally or alternatively provide one or more artefacts of fabrication processing—such as that illustrated by stages 200-207—which comprises epi deposition, from one direction, through a hole formed with a separation layer.

By way of illustration and not limitation, FIG. 4 further shows distances y1 through y8 which variously illustrate relationships of SD structures each to respective channels in an adjoining channel stack structure. For example, in an illustrative scenario according to one embodiment, a topmost part of epitaxial structure 270 extends vertically, by a distance y1, above a topmost part of the top channel 451a of channel stack structure 450—e.g., wherein a bottommost part of epitaxial structure 270 extends vertically, by a distance y2, below a bottommost part of the bottom channel 451b of channel stack structure 450. In one such embodiment, distance y1 is substantially larger (e.g., by at least 10%) than distance y2—e.g., wherein a difference between distances y1, y2 is in a range of 20% to 100% of distance y2.

In this particular context, the terms "top," "bottom," "above," and "below" are with reference to the direction 401 shown. For example, channel stack structure 450 comprises first channels, wherein the top channel 451a is the farthest one of the first channels from separation layer 410, and wherein the bottom channel 451b is the closest one of the first channels to separation layer 410. By contrast, channel stack structure 460 comprises second channels, wherein the top channel 461a is the closest one of the second channels to separation layer 410, and wherein the bottom channel 461b is the farthest one of the first channels from separation layer 410.

Additionally or alternatively, in various embodiments, a topmost part of epitaxial structure 271 extends vertically, by a distance y3, above a topmost part of the top channel 461a of channel stack structure 460—e.g., wherein a bottommost part of epitaxial structure 271 extends vertically, by a distance y4, below a bottommost part of the bottom channel 461b of channel stack structure 460. In one such embodiment, distance y3 is substantially larger (e.g., by at least 10%) than distance y4—e.g., wherein a difference between distances y3, y4 is in a range of 20% to 100% of distance y4.

Additionally or alternatively, in various embodiments, a topmost part of epitaxial structure 272 extends vertically, by a distance y5, above a topmost part of the top channel 451a of channel stack structure 450—e.g., wherein a bottommost part of epitaxial structure 272 extends vertically, by a distance y6, below a bottommost part of the bottom channel 451b of channel stack structure 450. In one such embodiment, distance y5 is substantially larger (e.g., by at least 10%) than distance y6—e.g., wherein a difference between distances y5, y6 is in a range of 20% to 100% of distance y6.

Additionally or alternatively, in various embodiments, a topmost part of epitaxial structure 273 extends vertically, by a distance y7, above a topmost part of the top channel 461a of channel stack structure 460—e.g., wherein a bottommost part of epitaxial structure 273 extends vertically, by a distance y8, below a bottommost part of the bottom channel 461b of channel stack structure 460. In one such embodiment, distance y7 is substantially larger (e.g., by at least 10%) than distance y8—e.g., wherein a difference between distances y7, y8 is in a range of 20% to 100% of distance y8.

In various embodiments, IC 400 includes some or all of the features of the structures formed at stage 207. For example, separation layer 410 provides functionality of separation layer 210—e.g., wherein surfaces 412, 413 correspond to surfaces 212, 213 (respectively). Additionally or alternatively, channel stack structures 450, 460 provide functionality such as that of channel stack structures 250, 260 (respectively)—e.g., wherein spacer structures 454 of channel stack structure 450, and spacer structures 464 of channel stack structure 460 correspond functionally to spacer structures 254, and spacer structures 264 (respectively). In some embodiments, SD structures 470-473 provide functionality such as that of SD structures 270b-273b (respectively). Alternatively or in addition, contacts 480-483 correspond functionally to contacts 280-283 (respectively).

FIG. 5 illustrates features of a method 500 to provide SD structures of an IC device according to an embodiment. Method 500 is one example of an embodiment wherein structures of a first active circuit component—e.g., the structures including a first one or more channel structures—are formed on a first side of a separation layer. Furthermore, structures of a second active circuit component—e.g., the structures including a second one or more channel structures—are formed on a second side of the separation layer. In one such embodiment, epitaxial (epi) material is subsequently deposited from one side of the separation layer, and through a hole structure to an opposite side of the separation layer, to concurrently form SD structures which each adjoin a different respective one or more channel structures. In one embodiment, method 500 is performed to provide features such as those of one of ICs 100, 300, 400—e.g., wherein processing such as that illustrated by stages 200-207 includes, is according to, or is otherwise based on method 500.

As shown in FIG. 5, method 500 comprises (at 510) forming a first channel stack structure at a first surface of a separation layer, wherein the first channel stack structure comprises a first plurality of channel structures which are arranged in a first stacked configuration with each other. In one such embodiment, the first channel stack structure is one of channel stack structures 120, 250, 350, 450 (for example).

Method 500 further comprises (at 512) forming a second channel stack structure at a second surface of the separation layer, wherein the second channel stack structure comprises a second plurality of channel structures which are arranged in a second stacked configuration with each other. For example, the second channel stack structure is one of channel stack structures 130, 260, 360, 450, in various embodiments.

Method 500 further comprises (at 514) etching, drilling, or otherwise forming a first hole structure that extends to each of the first surface and the second surface. In one such embodiment, the first hole structure is formed at least in part with a sidewall of an insulator material of the separation layer—e.g., wherein the sidewall is aligned with respective sides of the first and second channel stack structures.

After forming the first hole structure at 514, method 500 (at 516) deposits a first epitaxial material into the first hole structure. For example, the first epitaxial material is directed into a hole which extends along the respective sides of the first and second channel stack structures, and through the separation layer. In one such embodiment, the first epitaxial material flows along the respective sides, resulting in a concurrent growth of epitaxial structures each on a different one of the respective first sides. The epi deposition at 516 thus concurrently forms a first SD structure at a first side of the first channel stack structure, and a second SD structure at a second side of the second channel stack structure. In one such embodiment, the first and second SD structures are SD structures 160, 161 (respectively).

In various embodiments, after the depositing at 516, the first plurality of channel structures each extend to the first SD structure—e.g., wherein the second plurality of channel structures each extend to the second SD structure, and wherein the first hole structure extends into a first region which is between the first SD structure and the second SD structure.

In some embodiments, method 500 further comprises additional operations (not shown) to form another two SD structures which are each at a respective one of the first and second channel structures. By way of illustration and not limitation, such additional operations comprise forming a second hole structure that extends to each of the first surface and the second surface of the separation layer. After the second hole structure has been formed, a second epitaxial material (in some embodiments, the same material deposited at 516) is deposited into the second hole structure to concurrently form a third SD structure at a third side of the first channel stack structure, and a fourth SD structure at a fourth side of the second channel stack structure. In one such embodiment, the first plurality of channel structures each extend to the third SD structure—e.g., wherein the second plurality of channel structures each extend to the fourth SD structure, and wherein the second hole structure extends into a second region which is between the third SD structure and the fourth SD structure. For example, the third SD structure and fourth SD structure are SD structures 162, 163 (respectively), in an embodiment.

Figure 6:
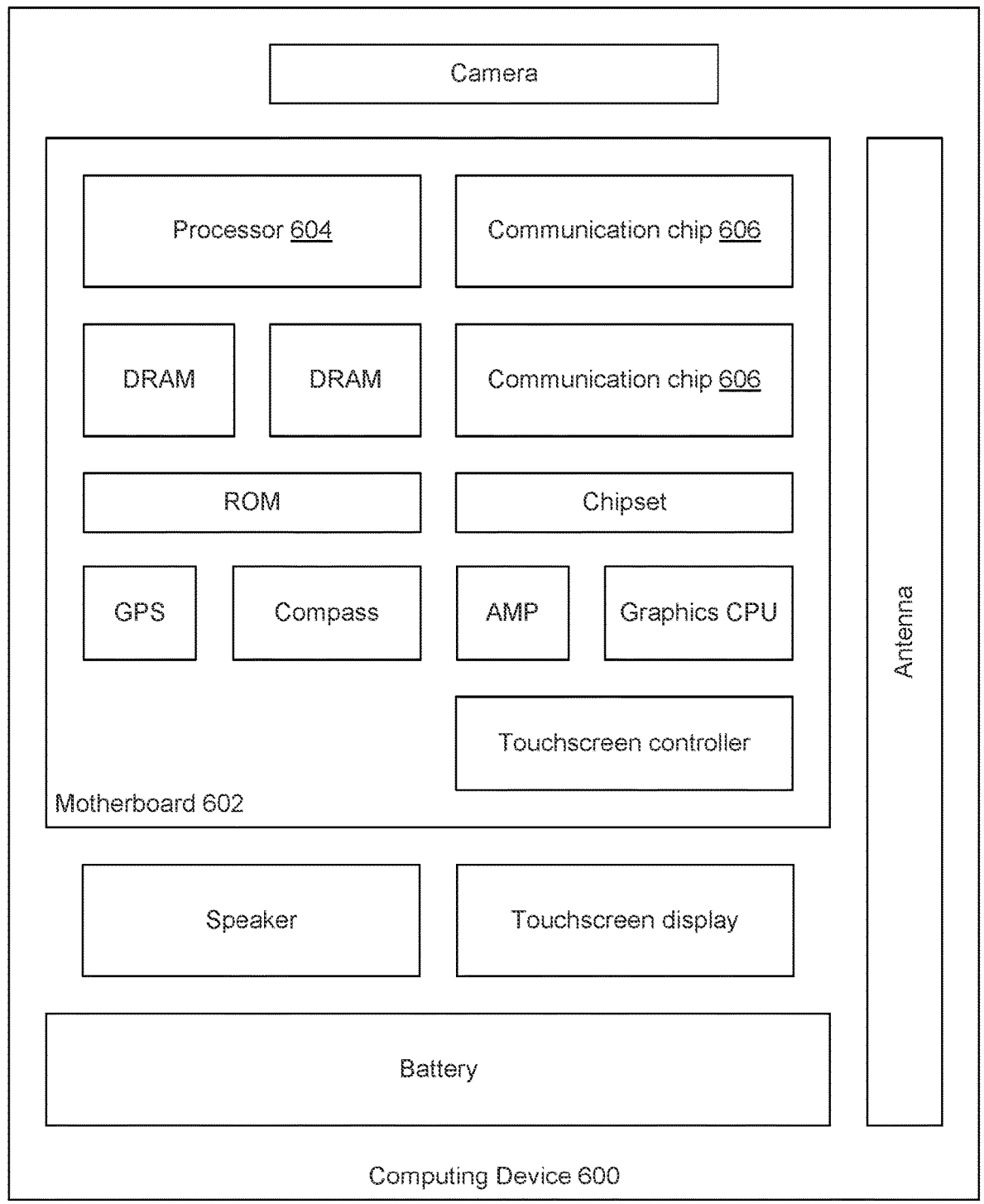
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
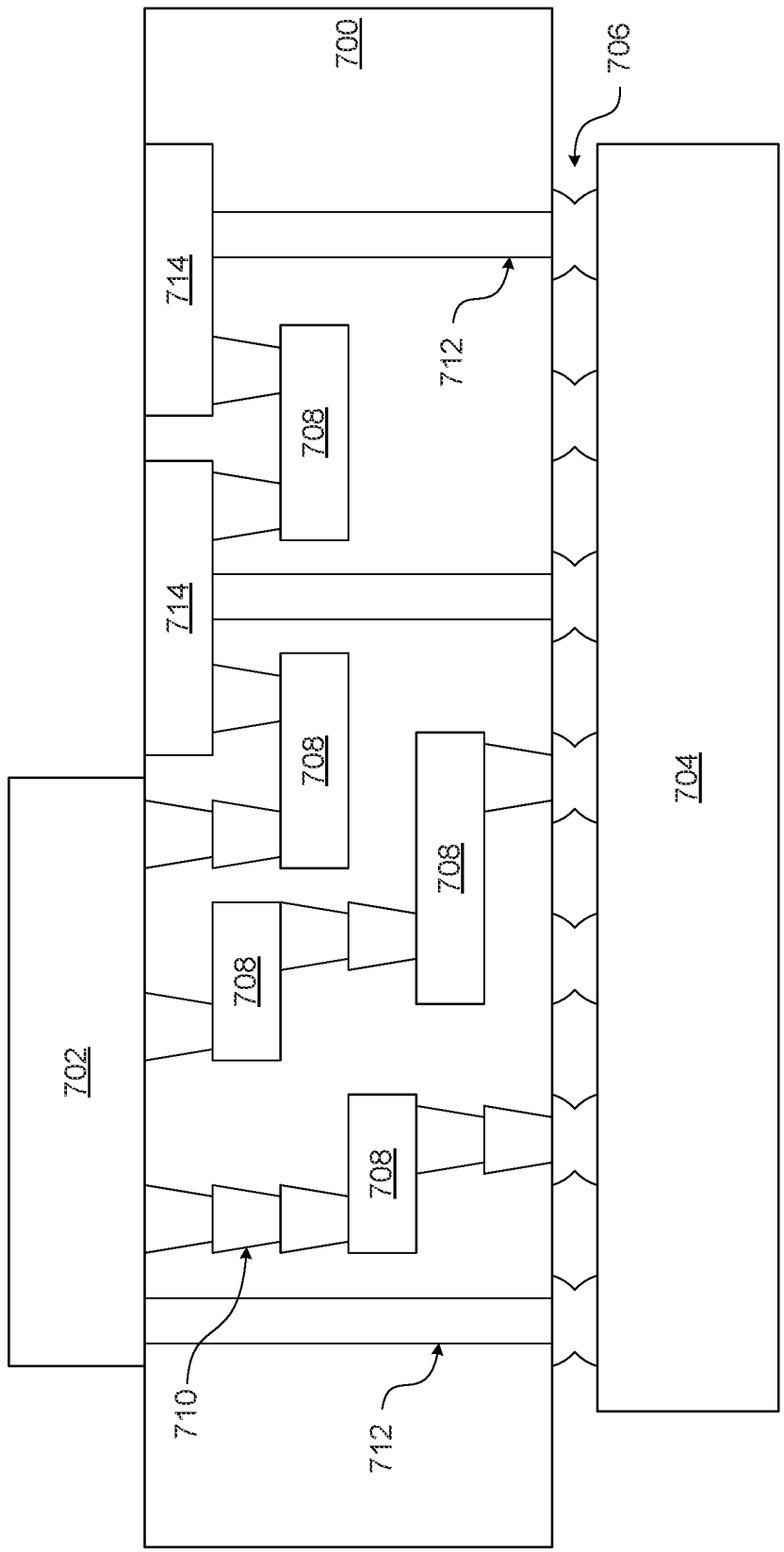
FIG. 7 is a cross-sectional view of an interposer implementing one or more embodiments.

FIG. 7 illustrates an interposer 700 that includes one or more embodiments. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702, 704 are attached to opposing sides of the interposer 700. In other embodiments, the first and second substrates 702, 704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with some embodiments, apparatuses or processes disclosed herein may be used in the fabrication of interposer 700.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

In one or more first embodiments, an integrated circuit (IC) comprises a separation layer comprising a first surface and a second surface which is opposite the first surface, wherein the separation layer forms a first hole structure that extends to each of the first surface and the second surface, a first channel stack structure at the first surface, the first channel stack structure comprising a first plurality of channel structures, a first source or drain (SD) structure comprising a first portion of a first epitaxial material in contact with each of the first plurality of channel structures, a second channel stack structure at the second surface, the second channel stack structure comprising a second plurality of channel structures, and a second SD structure comprising a second portion of the first epitaxial material in contact with each of the second plurality of channel structures, wherein the first hole structure extends into a first region which is between the first SD structure and the second SD structure.

In one or more second embodiments, further to the first embodiment, the separation layer further forms a second hole structure that extends to each of the first surface and the second surface, the IC further comprising a third SD structure comprising a second epitaxial material, wherein the first plurality of channel structures each extend to the third SD structure, and a fourth SD structure comprising the second epitaxial material, wherein the second plurality of channel structures each extend to the fourth SD structure, wherein the second hole structure extends into a second region which is between the third SD structure and the fourth SD structure.

In one or more third embodiments, further to the first embodiment or the second embodiment, a first vertical extent of the first SD structure above a first channel structure of the first channel stack structure is substantially greater than a second vertical extent of the first SD structure below a second channel structure of the first channel stack structure, the first channel structure is a furthest channel of the first channel stack structure from the separation layer, and the second channel structure is a closest channel of the first channel stack structure to the separation layer.

In one or more fourth embodiments, further to the third embodiment, a third vertical extent of the second SD structure above a third channel structure of the second channel stack structure is substantially greater than a fourth vertical extent of the second SD structure below a fourth channel structure of the second channel stack structure, the third channel structure is a closest channel of the second channel stack structure to the separation layer, and the fourth channel structure is a furthest channel of the second channel stack structure from the separation layer.

In one or more fifth embodiments, further to the fourth embodiment, the separation layer further forms a second hole structure that extends to each of the first surface and the second surface, the IC further comprising a third SD structure comprising a second epitaxial material, wherein the first plurality of channel structures each extend to the third SD structure, and a fourth SD structure comprising the second epitaxial material, wherein the second plurality of channel structures each extend to the fourth SD structure, wherein the second hole structure extends into a second region which is between the third SD structure and the fourth SD structure.

In one or more sixth embodiments, further to the fifth embodiment, a fifth vertical extent of the third SD structure above the first channel structure is substantially greater than a sixth vertical extent of the third SD structure below the second channel structure.

In one or more seventh embodiments, further to the sixth embodiment, a seventh vertical extent of the fourth SD structure above the third channel structure is substantially greater than an eighth vertical extent of the fourth SD structure below the fourth channel structure.

In one or more eighth embodiments, further to any of the first through third embodiments, a first crystal orientation of the first epitaxial material in the first SD structure, and a second crystal orientation of the first epitaxial material in the second SD structure, each face a first direction along a dimension which extends perpendicularly to the first surface.

In one or more ninth embodiments, further to the eighth embodiment, the separation layer further forms a second hole structure that extends to each of the first surface and the second surface, the IC further comprises a third SD structure comprising a second epitaxial material, wherein the first plurality of channel structures each extend to the third SD structure, and a fourth SD structure comprising the second epitaxial material, wherein the second plurality of channel structures each extend to the fourth SD structure, the second hole structure extends into a second region which is between the third SD structure and the fourth SD structure, a third crystal orientation of the second epitaxial material in the third SD structure, and a fourth crystal orientation of the second epitaxial material in the fourth SD structure, each face the first direction along the dimension.

In one or more tenth embodiments, further to any of the first through third embodiments, the first one or more channel structures comprise nanowires or nanoribbons.

In one or more eleventh embodiments, a system comprises a substrate, a power supply, and an integrated circuit (IC) die attached to the substrate and coupled to the power supply, the IC die comprising a separation layer comprising a first surface and a second surface which is opposite the first surface, wherein the separation layer forms a first hole structure that extends to each of the first surface and the second surface, a first channel stack structure at the first surface, the first channel stack structure comprising a first plurality of channel structures, a first source or drain (SD) structure comprising a first portion of a first epitaxial material in contact with each of the first plurality of channel structures, a second channel stack structure at the second surface, the second channel stack structure comprising a second plurality of channel structures, and a second SD structure comprising a second portion of the first epitaxial material in contact with each of the second plurality of channel structures, wherein the first hole structure extends into a first region which is between the first SD structure and the second SD structure.

In one or more twelfth embodiments, further to the eleventh embodiment, the separation layer further forms a second hole structure that extends to each of the first surface and the second surface, the IC further comprising a third SD structure comprising a second epitaxial material, wherein the first plurality of channel structures each extend to the third SD structure, and a fourth SD structure comprising the second epitaxial material, wherein the second plurality of channel structures each extend to the fourth SD structure, wherein the second hole structure extends into a second region which is between the third SD structure and the fourth SD structure.

In one or more thirteenth embodiments, further to the eleventh embodiment or the twelfth embodiment, a first vertical extent of the first SD structure above a first channel structure of the first channel stack structure is substantially greater than a second vertical extent of the first SD structure below a second channel structure of the first channel stack structure, the first channel structure is a furthest channel of the first channel stack structure from the separation layer, and the second channel structure is a closest channel of the first channel stack structure to the separation layer.

In one or more fourteenth embodiments, further to the thirteenth embodiment, a third vertical extent of the second SD structure above a third channel structure of the second channel stack structure is substantially greater than a fourth vertical extent of the second SD structure below a fourth channel structure of the second channel stack structure, the third channel structure is a closest channel of the second channel stack structure to the separation layer, and the fourth channel structure is a furthest channel of the second channel stack structure from the separation layer.

In one or more fifteenth embodiments, further to the fourteenth embodiment, the separation layer further forms a second hole structure that extends to each of the first surface and the second surface, the IC further comprising a third SD structure comprising a second epitaxial material, wherein the first plurality of channel structures each extend to the third SD structure, and a fourth SD structure comprising the second epitaxial material, wherein the second plurality of channel structures each extend to the fourth SD structure, wherein the second hole structure extends into a second region which is between the third SD structure and the fourth SD structure.

In one or more sixteenth embodiments, further to the fifteenth embodiment, a fifth vertical extent of the third SD structure above the first channel structure is substantially greater than a sixth vertical extent of the third SD structure below the second channel structure.

In one or more seventeenth embodiments, further to the sixteenth embodiment, a seventh vertical extent of the fourth SD structure above the third channel structure is substantially greater than an eighth vertical extent of the fourth SD structure below the fourth channel structure.

In one or more eighteenth embodiments, further the eleventh embodiment or the twelfth embodiment, a first crystal orientation of the first epitaxial material in the first SD structure, and a second crystal orientation of the first epitaxial material in the second SD structure, each face a first direction along a dimension which extends perpendicularly to the first surface.

In one or more nineteenth embodiments, further to the eighteenth embodiment, the separation layer further forms a second hole structure that extends to each of the first surface and the second surface, the IC further comprises a third SD structure comprising a second epitaxial material, wherein the first plurality of channel structures each extend to the third SD structure, and a fourth SD structure comprising the second epitaxial material, wherein the second plurality of channel structures each extend to the fourth SD structure, the second hole structure extends into a second region which is between the third SD structure and the fourth SD structure, a third crystal orientation of the second epitaxial material in the third SD structure, and a fourth crystal orientation of the second epitaxial material in the fourth SD structure, each face the first direction along the dimension.

In one or more twentieth embodiments, further the eleventh embodiment or the twelfth embodiment, the first one or more channel structures comprise nanowires or nanoribbons.

In one or more twenty-first embodiments, a method for fabricating an integrated circuit (IC) comprises forming a first one or more channel structures which are over a first surface of a separation layer, forming a second one or more channel structures which are under a second surface of the separation layer, forming a first hole structure that extends to each of the first surface and the second surface, and after forming the first hole structure, depositing a first portion of first epitaxial material into the first hole structure to concurrently form a first SD structure at a first side of the first one or more channel structures, and a second SD structure at a second side of the second one or more channel structures, wherein the first one or more channel structures each extend to the first SD structure, wherein the second one or more channel structures each extend to the second SD structure, and wherein the first hole structure extends into a first region which is between the first SD structure and the second SD structure.

In one or more twenty-second embodiments, further to the twenty-first embodiment, the method further comprises forming a second hole structure that extends to each of the first surface and the second surface, and after forming the second hole structure, depositing a second epitaxial material into the second hole structure to concurrently form a third SD structure at a third side of the first one or more channel structures, and a fourth SD structure at a fourth side of the second one or more channel structures, wherein the first one or more channel structures each extend to the third SD structure, wherein the second one or more channel structures each extend to the fourth SD structure, and wherein the second hole structure extends into a second region which is between the third SD structure and the fourth SD structure.

In one or more twenty-third embodiments, further to the twenty-first embodiment or the twenty-second embodiment, a first vertical extent of the first SD structure above a first channel structure of the first one or more channel structures is substantially greater than a second vertical extent of the first SD structure below a second channel structure of the first one or more channel structures, the first channel structure is a furthest channel of the first one or more channel structures from the separation layer, and the second channel structure is a closest channel of the first one or more channel structures to the separation layer.

In one or more twenty-fourth embodiments, further to the twenty-third embodiment, a third vertical extent of the second SD structure above a third channel structure of the second one or more channel structures is substantially greater than a fourth vertical extent of the second SD structure below a fourth channel structure of the second one or more channel structures, the third channel structure is a closest channel of the second one or more channel structures to the separation layer, and the fourth channel structure is a furthest channel of the second one or more channel structures from the separation layer.

In one or more twenty-fifth embodiments, further to the twenty-fourth embodiment, the method further comprises forming a second hole structure that extends to each of the first surface and the second surface, and after forming the second hole structure, depositing a second epitaxial material into the second hole structure to concurrently form a third SD structure at a third side of the first one or more channel structures, and a fourth SD structure at a fourth side of the second one or more channel structures, wherein the first one or more channel structures each extend to the third SD structure, wherein the second one or more channel structures each extend to the fourth SD structure, and wherein the second hole structure extends into a second region which is between the third SD structure and the fourth SD structure.

In one or more twenty-sixth embodiments, further to the twenty-fifth embodiment, a fifth vertical extent of the third SD structure above the first channel structure is substantially greater than a sixth vertical extent of the third SD structure below the second channel structure.

In one or more twenty-seventh embodiments, further to the twenty-sixth embodiment, a seventh vertical extent of the fourth SD structure above the third channel structure is substantially greater than an eighth vertical extent of the fourth SD structure below the fourth channel structure.

In one or more twenty-eighth embodiments, further to any of the twenty-first through twenty-third embodiments, a first crystal orientation of the first epitaxial material in the first SD structure, and a second crystal orientation of the first epitaxial material in the second SD structure, each face a first direction along a dimension which extends perpendicularly to the first surface.

In one or more twenty-ninth embodiments, further to the twenty-eighth embodiment, the method further comprises forming a second hole structure that extends to each of the first surface and the second surface, and after forming the second hole structure, depositing a second epitaxial material into the second hole structure to concurrently form a third SD structure at a third side of the first one or more channel structures, and a fourth SD structure at a fourth side of the second one or more channel structures, wherein the first one or more channel structures each extend to the third SD structure, wherein the second one or more channel structures each extend to the fourth SD structure, wherein the second hole structure extends into a second region which is between the third SD structure and the fourth SD structure, and wherein a third crystal orientation of the second epitaxial material in the third SD structure, and a fourth crystal orientation of the second epitaxial material in the fourth SD structure, each face the first direction along the dimension.

In one or more thirtieth embodiments, further to any of the twenty-first through twenty-third embodiments, the first one or more channel structures comprise nanowires or nanoribbons.

Techniques and architectures for providing source or drain structures of an integrated circuit are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) comprising:
a separation layer comprising a first surface in a first horizontal plane and a second surface which is opposite the first surface in a second horizontal plane, wherein the separation layer forms a first hole structure that extends to each of the first surface and the second surface;
a first channel stack structure which is vertically above the first surface, the first channel stack structure comprising a first plurality of channel structures;
a first source or drain (SD) structure comprising a first portion of a first epitaxial material in contact with each of the first plurality of channel structures;
a second channel stack structure which is vertically below the second surface, the second channel stack structure comprising a second plurality of channel structures;
a second SD structure comprising a second portion of the first epitaxial material in contact with each of the second plurality of channel structures;
a first conductive contact structure which is electrically coupled at the first SD structure; and
a second conductive contact structure which is electrically coupled at the second SD structure;
wherein:
the first hole structure extends into a first region which is between the first SD structure and the second SD structure;
a portion of the first conductive contact structure is vertically above both the first SD structure and the first surface; and
a portion of the second conductive contact structure is vertically below both the second SD structure and the second surface.

2. The IC of claim 1, wherein the separation layer further forms a second hole structure that extends to each of the first surface and the second surface, the IC further comprising:
a third SD structure comprising a second epitaxial material, wherein the first plurality of channel structures each extend to the third SD structure; and
a fourth SD structure comprising the second epitaxial material, wherein the second plurality of channel structures each extend to the fourth SD structure;
wherein the second hole structure extends into a second region which is between the third SD structure and the fourth SD structure.

3. The IC of claim 1, wherein:
a first vertical extent of the first SD structure above a first channel structure of the first channel stack structure is substantially greater than a second vertical extent of the first SD structure below a second channel structure of the first channel stack structure;
the first channel structure is a furthest channel of the first channel stack structure from the separation layer; and
the second channel structure is a closest channel of the first channel stack structure to the separation layer.

4. The IC of claim 3, wherein:
a third vertical extent of the second SD structure above a third channel structure of the second channel stack structure is substantially greater than a fourth vertical extent of the second SD structure below a fourth channel structure of the second channel stack structure;
the third channel structure is a closest channel of the second channel stack structure to the separation layer; and
the fourth channel structure is a furthest channel of the second channel stack structure from the separation layer.

5. The IC of claim 4, wherein the separation layer further forms a second hole structure that extends to each of the first surface and the second surface, the IC further comprising:
a third SD structure comprising a second epitaxial material, wherein the first plurality of channel structures each extend to the third SD structure; and
a fourth SD structure comprising the second epitaxial material, wherein the second plurality of channel structures each extend to the fourth SD structure;
wherein the second hole structure extends into a second region which is between the third SD structure and the fourth SD structure.

6. The IC of claim 5, wherein a fifth vertical extent of the third SD structure above the first channel structure is substantially greater than a sixth vertical extent of the third SD structure below the second channel structure.

7. The IC of claim 6, wherein a seventh vertical extent of the fourth SD structure above the third channel structure is substantially greater than an eighth vertical extent of the fourth SD structure below the fourth channel structure.

8. The IC of claim 1, wherein:
a first crystal orientation of the first epitaxial material in the first SD structure, and a second crystal orientation of the first epitaxial material in the second SD structure, each face a first direction along a dimension which extends perpendicularly to the first surface.

9. The IC of claim 8, wherein:
the separation layer further forms a second hole structure that extends to each of the first surface and the second surface;
the IC further comprises:
a third SD structure comprising a second epitaxial material, wherein the first plurality of channel structures each extend to the third SD structure; and
a fourth SD structure comprising the second epitaxial material, wherein the second plurality of channel structures each extend to the fourth SD structure;
the second hole structure extends into a second region which is between the third SD structure and the fourth SD structure; and
a third crystal orientation of the second epitaxial material in the third SD structure, and a fourth crystal orientation of the second epitaxial material in the fourth SD structure, each face the first direction along the dimension.

10. The IC of claim 1, wherein:
the separation layer is a layer of an insulator material which forms each of the first surface, the second surface, and the first hole structure;
the IC further comprises:
a first gate electrode structure which extends around each of the first plurality of channel structures;
a second gate electrode structure which extends around each of the second plurality of channel structures;
a bottom side of the first gate electrode structure adjoins the first surface; and
a top side of the second gate electrode structure adjoins the second surface.

11. A system comprising:
a substrate;
a power supply; and
an integrated circuit (IC) die attached to the substrate and coupled to the power supply, the IC die comprising:
a separation layer comprising a first surface in a first horizontal plane and a second surface which is opposite the first surface in a second horizontal plane, wherein the separation layer forms a first hole structure that extends to each of the first surface and the second surface;
a first channel stack structure which is vertically above the first surface, the first channel stack structure comprising a first plurality of channel structures;
a first source or drain (SD) structure comprising a first portion of a first epitaxial material in contact with each of the first plurality of channel structures;
a second channel stack structure which is vertically below the second surface, the second channel stack structure comprising a second plurality of channel structures;
a second SD structure comprising a second portion of the first epitaxial material in contact with each of the second plurality of channel structures;
a first conductive contact structure which is electrically coupled at the first SD structure; and
a second conductive contact structure which is electrically coupled at the second SD structure;
wherein:
the first hole structure extends into a first region which is between the first SD structure and the second SD structure;
a portion of the first conductive contact structure is vertically above both the first SD structure and the first surface; and
a portion of the second conductive contact structure is vertically below both the second SD structure and the second surface.

12. The system of claim 11, wherein the separation layer further forms a second hole structure that extends to each of the first surface and the second surface, the IC further comprising:
a third SD structure comprising a second epitaxial material, wherein the first plurality of channel structures each extend to the third SD structure; and
a fourth SD structure comprising the second epitaxial material, wherein the second plurality of channel structures each extend to the fourth SD structure;
wherein the second hole structure extends into a second region which is between the third SD structure and the fourth SD structure.

13. The system of claim 11, wherein:
a first vertical extent of the first SD structure above a first channel structure of the first channel stack structure is substantially greater than a second vertical extent of the first SD structure below a second channel structure of the first channel stack structure;
the first channel structure is a furthest channel of the first channel stack structure from the separation layer; and
the second channel structure is a closest channel of the first channel stack structure to the separation layer.

14. The system of claim 11, wherein:
a first crystal orientation of the first epitaxial material in the first SD structure, and a second crystal orientation of the first epitaxial material in the second SD structure, each face a first direction along a dimension which extends perpendicularly to the first surface.

15. The system of claim 11, wherein:
the separation layer is a layer of an insulator material which forms each of the first surface, the second surface, and the first hole structure;
the IC die further comprises:
a first gate electrode structure which extends around each of the first plurality of channel structures;
a second gate electrode structure which extends around each of the second plurality of channel structures;
a bottom side of the first gate electrode structure adjoins the first surface; and
a top side of the second gate electrode structure adjoins the second surface.

16. A method for fabricating an integrated circuit (IC), the method comprising:
forming a first one or more channel structures which are vertically above a first surface of a separation layer, wherein the first surface is in a first horizontal plane;
forming a second one or more channel structures which are vertically below a second surface of the separation layer, wherein the second surface is opposite the first surface in a second horizontal plane;
forming a first hole structure that extends to each of the first surface and the second surface; and
after forming the first hole structure, depositing a first portion of first epitaxial material into the first hole structure to concurrently form a first SD structure at a first side of the first one or more channel structures, and a second SD structure at a second side of the second one or more channel structures;
forming a first conductive contact structure which is electrically coupled at the first SD structure; and
forming a second conductive contact structure which is electrically coupled at the second SD structure;
wherein:
the first one or more channel structures each extend to the first SD structure;
the second one or more channel structures each extend to the second SD structure;
the first hole structure extends into a first region which is between the first SD structure and the second SD structure;
a portion of the first conductive contact structure is vertically above both the first SD structure and the first surface; and
a portion of the second conductive contact structure is vertically below both the second SD structure and the second surface.

17. The method of claim 16, further comprising:
forming a second hole structure that extends to each of the first surface and the second surface; and
after forming the second hole structure, depositing a second epitaxial material into the second hole structure to concurrently form a third SD structure at a third side of the first one or more channel structures, and a fourth SD structure at a fourth side of the second one or more channel structures;
wherein the first one or more channel structures each extend to the third SD structure;
wherein the second one or more channel structures each extend to the fourth SD structure; and
wherein the second hole structure extends into a second region which is between the third SD structure and the fourth SD structure.

18. The method of claim 16, wherein:
a first vertical extent of the first SD structure above a first channel structure of the first one or more channel structures is substantially greater than a second vertical extent of the first SD structure below a second channel structure of the first one or more channel structures;

the first channel structure is a furthest channel of the first one or more channel structures from the separation layer; and the second channel structure is a closest channel of the first one or more channel structures to the separation layer.

19. The method of claim 16, wherein:

a first crystal orientation of the first epitaxial material in the first SD structure, and a second crystal orientation of the first epitaxial material in the second SD structure, each face a first direction along a dimension which extends perpendicularly to the first surface.

20. The method of claim 16, wherein:

the separation layer is a layer of an insulator material which forms each of the first surface, the second surface, and the first hole structure;

the IC further comprises:

a first gate electrode structure which extends around each of the first one or more channel structures;

a second gate electrode structure which extends around each of the second one or more channel structures;

a bottom side of the first gate electrode structure adjoins the first surface; and a top side of the second gate electrode structure adjoins the second surface.

* * * * *